United States Patent
Park et al.

(10) Patent No.: US 9,767,722 B2
(45) Date of Patent: Sep. 19, 2017

(54) DISPLAY DEVICE

(71) Applicant: Samsung Display Co., Ltd., Yongin-si, Gyeonggi-do (KR)

(72) Inventors: Ji Yong Park, Yongin-si (KR); Tae Gon Kim, Cheonan-si (KR); Dong-Yoon So, Asan-si (KR); Sung Ho Cho, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/970,518

(22) Filed: Dec. 15, 2015

(65) Prior Publication Data

US 2016/0196775 A1    Jul. 7, 2016

(30) Foreign Application Priority Data

Jan. 7, 2015 (KR) .................. 10-2015-0001987

(51) Int. Cl.
*G09G 5/00* (2006.01)
*G09G 3/20* (2006.01)
*H05K 5/00* (2006.01)
*H05K 5/06* (2006.01)

(52) U.S. Cl.
CPC ............. *G09G 3/20* (2013.01); *H05K 5/0017* (2013.01); *H05K 5/06* (2013.01); *G09G 2300/0426* (2013.01); *G09G 2310/0275* (2013.01); *G09G 2330/08* (2013.01)

(58) Field of Classification Search
CPC ............... G09G 3/3225; G09G 3/3648; G09G 2300/0413; G09G 2300/0426; G09G 2310/0275; G09G 2330/08; G09G 2330/10; H01L 27/3276; H01L 2251/568
See application file for complete search history.

(56) References Cited

U.S. PATENT DOCUMENTS

| | | | | |
|---|---|---|---|---|
| 6,229,510 B1* | 5/2001 | Kim | ................. | G02F 1/1362 345/87 |
| 7,705,820 B2* | 4/2010 | Park | ................. | G02F 1/13452 330/207 A |
| 8,089,439 B2* | 1/2012 | Ootsu | ................. | G02F 1/1345 345/100 |
| 8,865,491 B2* | 10/2014 | Tomikawa | ................. | H01L 33/48 438/28 |

(Continued)

FOREIGN PATENT DOCUMENTS

| KR | 10-2006-0088191 A | 8/2006 |
|---|---|---|
| KR | 1020060088191 A * | 8/2006 |

(Continued)

*Primary Examiner* — Joe H Cheng
(74) *Attorney, Agent, or Firm* — Lewis Roca Rothgerber Christie LLP

(57) ABSTRACT

Provided is a display device including: a plurality of pixels; a plurality of data lines connected to the plurality of pixels; a data driver configured to generate a data voltage applied to the plurality of pixels; a plurality of fan-out lines configured to connect the plurality of data lines and the data driver; a sealant at a periphery of a display area in which the plurality of pixels and the plurality of data lines are arranged, and configured to seal the display area; a metal layer below the sealant; and a repair line configured to connect the data driver and the metal layer.

20 Claims, 3 Drawing Sheets

(56) References Cited

U.S. PATENT DOCUMENTS

| | | | |
|---|---|---|---|
| 2005/0140265 A1* | 6/2005 | Hirakata | H01L 51/5259 313/483 |
| 2005/0168491 A1* | 8/2005 | Takahara | G09G 3/006 345/690 |
| 2009/0033823 A1 | 2/2009 | Chung et al. | |
| 2009/0294771 A1* | 12/2009 | Kim | G02F 1/136204 257/59 |
| 2010/0157190 A1* | 6/2010 | Lee | G02F 1/136259 349/54 |
| 2010/0207106 A1* | 8/2010 | Lhee | H01L 27/3244 257/40 |
| 2010/0238368 A1* | 9/2010 | Kim | G02F 1/13458 349/40 |
| 2010/0265424 A1* | 10/2010 | Chiu | G02F 1/136259 349/54 |
| 2012/0153814 A1* | 6/2012 | Lee | H01L 51/524 313/504 |
| 2014/0292827 A1* | 10/2014 | Kang | G09G 3/20 345/690 |
| 2015/0102985 A1* | 4/2015 | Kim | G09G 3/3216 345/76 |
| 2015/0108480 A1* | 4/2015 | Xu | H01L 22/22 257/59 |
| 2015/0130751 A1* | 5/2015 | Teraguchi | G02F 1/13338 345/174 |

FOREIGN PATENT DOCUMENTS

| | | |
|---|---|---|
| KR | 10-2007-0082325 A | 8/2007 |
| KR | 10-2007-0107472 A | 11/2007 |
| KR | 10-2008-0022357 A | 3/2008 |
| KR | 10-2010-0065745 A | 6/2010 |
| KR | 10-2015-0021773 A | 3/2015 |

\* cited by examiner

DISPLAY DEVICE

CROSS-REFERENCE TO RELATED APPLICATION

This application claims priority to and the benefit of Korean Patent Application No. 10-2015-0001987, filed in the Korean Intellectual Property Office on Jan. 7, 2015, the content of which is incorporated herein in its entirety by reference.

BACKGROUND

1. Field

Embodiments of the present invention relate to a display device.

2. Description of the Related Art

Currently, display devices, such as liquid crystal displays, field emission displays, plasma display panels, and organic light emitting displays, are widely used.

Display devices generally include a plurality of gate lines extending in a row direction, a plurality of data lines extending in a column direction, and a plurality of pixels arranged at points where ones of the plurality of gate lines cross ones of the plurality of data lines. Each of the plurality of pixels is driven by a gate signal and a data voltage transferred by the plurality of gate lines and the plurality of data lines, respectively.

In a general manufacturing process of the display devices, a disconnection defect may occur in one of the data lines such that the display device may be defective, leading to a reduction in yield of the display devices. To overcome such a disconnection defect in a data line, a method of installing (e.g., forming) a separate repair line and short-circuiting the disconnected data line and the repair line has been suggested.

However, because the repair line is elongated around (e.g., extends around) an outside of a display area, resistance of the repair line is greater than resistance of the data line. Accordingly, the data voltage may not be sufficiently applied to a pixel which has the data voltage applied through the repair line, causing a bar-line spot to be generated.

The above information disclosed in this Background section is only for enhancement of understanding of the background of the invention, and therefore, it may contain information that does not form prior art.

SUMMARY

The present invention provides a display device including a repair line having reduced resistance.

An exemplary embodiment of the present invention provides a display device including: a plurality of pixels; a plurality of data lines connected to the plurality of pixels; a data driver configured to generate a data voltage applied to the plurality of pixels; a plurality of fan-out lines configured to connect the plurality of data lines and the data driver; a sealant at a periphery of a display area in which the plurality of pixels and the plurality of data lines are arranged, and configured to seal the display area; a metal layer below the sealant; and a repair line configured to connect the data driver and the metal layer.

The metal layer may include: a first metal layer at a right-side periphery of the display area with respect to a central line of the display area; and a second metal layer at a right-side periphery of the display area with respect to the central line of the display area, and the first metal layer may be electrically insulated from the second metal layer.

The repair line may include: a first repair line configured to connect the data driver and the first metal layer; and a second repair line configured to connect the data driver and the second metal layer.

The first metal layer may include: a first lower metal layer at the right-side circumference and below the sealant; and a first inner metal layer above the first lower metal layer and overlapping a portion of the first lower metal layer, and the first lower metal layer and the first inner metal layer may be electrically connected through a contact opening formed in an insulating layer between the first lower metal layer and the first inner metal layer.

The first inner metal layer may extend along the right-side periphery and overlap the portion of the first lower metal layer.

The first metal layer may further include a first outer metal layer overlapping another portion of the first lower metal layer.

The first outer metal layer may extend along the right-side periphery and overlap the other portion of the first lower metal layer, and may be electrically insulated from the first lower metal layer.

The first inner metal layer may be nearer to the display area than the first outer metal layer.

The first repair line may be connected to the first inner metal layer.

The first lower metal layer may have a lattice pattern and a plurality of lattice openings.

The display device may further include: an insulation substrate below the first lower metal layer; and a plurality of openings aligned with the plurality of lattice openings and exposing the insulation substrate, in which one of the openings overlapping the first inner metal layer from among the plurality of openings is filled with metal of the first inner metal layer, and one of the openings overlapping the first outer metal layer from among the plurality of openings is filled with metal of the first outer metal layer.

One of the openings which is offset from the first inner metal layer and the first outer metal layer but overlaps the sealant from among the plurality of openings may be filled with the sealant.

A diameter of the opening overlapping the first inner metal layer from among the plurality of openings may be less than that of the lattice opening.

The second metal layer may include: a second lower metal layer at the left-side periphery and below the sealant; and a second inner metal layer above the second lower metal layer and overlapping a portion of the second lower metal layer, and the second lower metal layer and the second inner metal layer may be electrically connected through a contact opening in an insulating layer positioned between the second lower metal layer and the second inner metal layer.

The second inner metal layer may extend along the left-side periphery and overlap the portion of the second lower metal layer.

The second metal layer may further include a second outer metal layer overlapping another portion of the second lower metal layer.

The second outer metal layer may extend along the left-side periphery and overlap the other portion of the second lower metal layer, and may be electrically insulated from the second lower metal layer.

The second inner metal layer may nearer the display area than the second outer metal layer.

The second repair line may be connected to the second inner metal layer.

According to exemplary embodiments of the present invention, the repair line is formed by using the metal layer positioned below the sealant such that the resistance of the repair line may be reduced, and thus, it is possible to ensure that the data voltage is sufficiently applied to the pixel having the data voltage applied through the repair line. Thus, a bar-line spot may be reduced or prevented.

DETAILED DESCRIPTION

Figure 1:
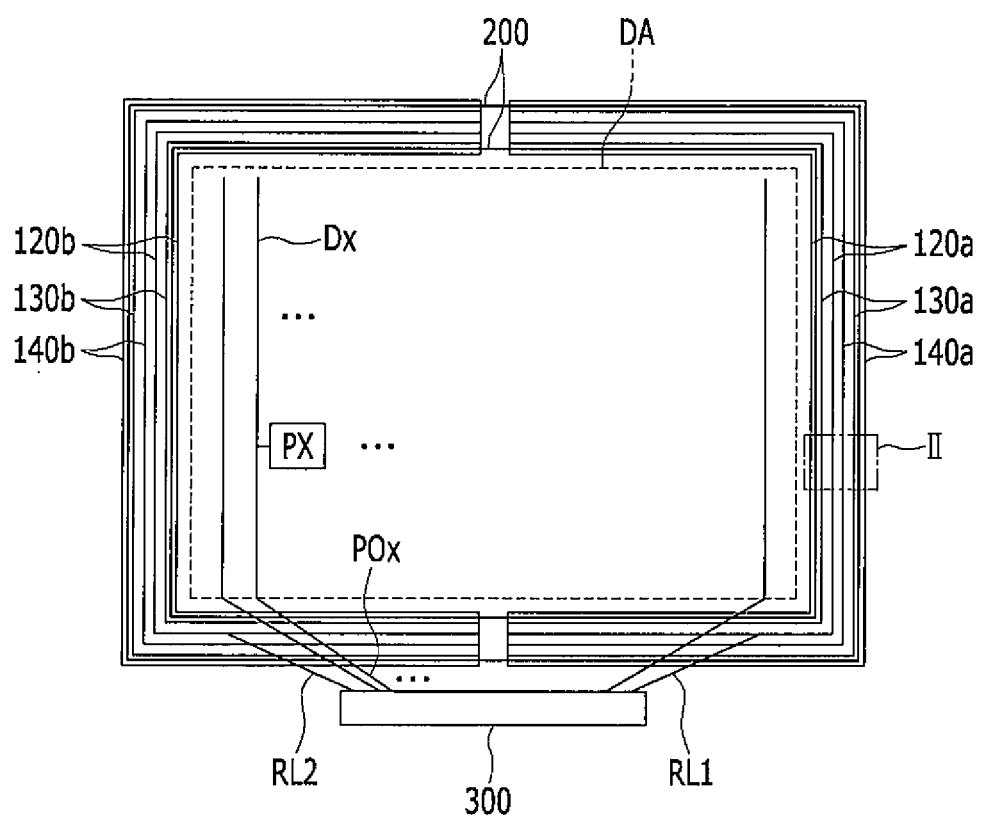
FIG. 1 is a diagram illustrating a display device according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention.

Further, like reference numerals designate like elements having the same configuration. Among the described embodiments, only a configuration and/or components which are different from the first exemplary embodiment may be described. Accordingly, the drawings and description are to be regarded as illustrative in nature and not restrictive.

It will be understood that when an element or layer is referred to as being "on", "connected to", or "coupled to" another element or layer, it may be directly on, connected, or coupled to the other element, or layer or one or more intervening elements or layers may also be present. When an element is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements. The same reference numerals designate the same elements. As used herein, the term "and/or" includes any and all combinations of one or more of the associated listed items. Further, the use of "may" when describing embodiments of the present invention relates to "one or more embodiments of the present invention". Expressions, such as "at least one of," when preceding a list of elements, modify the entire list of elements and do not modify the individual elements of the list. Also, the term "exemplary" is intended to refer to an example or illustration.

It will be understood that, although the terms first, second, third, etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, a first element, component, region, layer, or section discussed below could be termed a second element, component, region, layer, or section without departing from the teachings of example embodiments. In the figures, dimensions of the various elements, layers, etc. may be exaggerated for clarity of illustration.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly. As used herein, the terms "use," "using," and "used" may be considered synonymous with the terms "utilize," "utilizing," and "utilized," respectively.

The terminology used herein is for the purpose of describing particular example embodiments only and is not intended to be limiting of example embodiments. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The data driver and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the data driver may be formed on one integrated circuit (IC) chip or on separate IC chips. Further, the various components of the data driver may be implemented on a flexible printed circuit film, a tape carrier package (TCP), a printed circuit board (PCB), or formed on a same substrate as the data driver. Further, the various components of the data driver may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

Hereinafter, a display device according to one or more exemplary embodiments of the present invention will be described in detail with reference to the accompanying drawings. The display device according to exemplary embodiments of the present invention may be a liquid crystal display, a field emission display, a plasma display panel, or an organic light emitting display.

The display device according to one exemplary embodiment of the present invention may be an active matrix organic light emitting diode (AMOLED) display with wide quad extended graphics array (WQXGA), which refers to a resolution of 2560×1600 with an aspect ratio of 16:10. The AMOLED display may be used as a display device of, for example, a tablet or mobile terminal. The AMOLED display is merely an example, and the present invention is not limited thereto.

A display device including a repair line according to an exemplary embodiment of the present invention will be described with reference to FIGS. 1 to 3.

FIG. 1 is a diagram illustrating a display device according to an exemplary embodiment of the present invention. FIG. 2 is a diagram illustrating region II of FIG. 1 in detail. FIG. 3 is a cross-sectional view taken along the line of FIG. 2.

Figure 2:
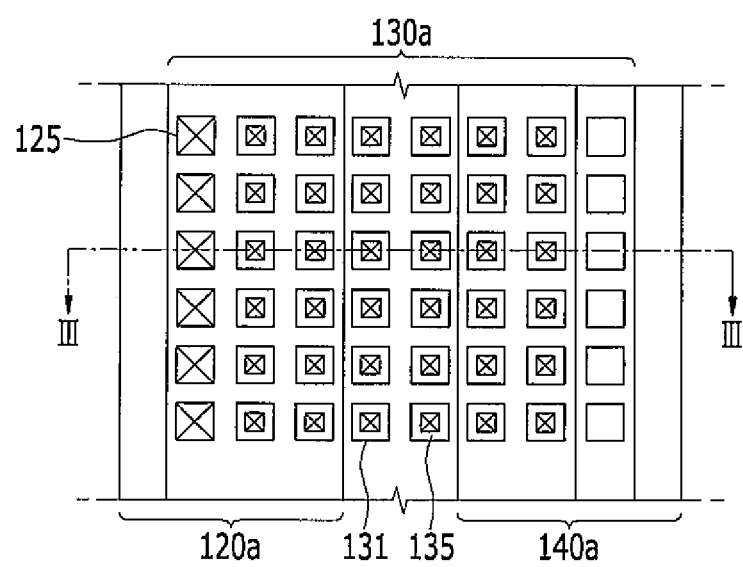
FIG. 2 is a diagram illustrating region II of FIG. 1 in detail.
Figure 3:
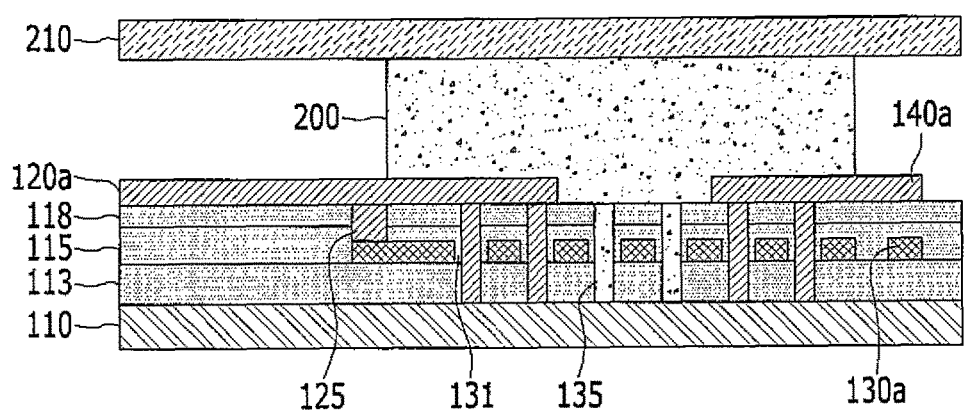
FIG. 3 is a cross-sectional view taken along the line III-III of FIG. 2.

Referring to FIGS. 1 to 3, the display device includes a display area DA in which a plurality of pixels PX and a plurality of data lines Dx connected to the plurality of pixels PX are formed. Further, the display device includes a data driver 300 for generating a data voltage that is applied to the plurality of pixels PX, a plurality of fan-out lines POx connecting the plurality of data lines Dx to the data driver 300, a sealant 200 sealing the display area DA, metal layers 120a, 120b, 130a, 130b, 140a, and 140b located below (e.g., under) the sealant 200, and repair lines RL1 and RL2 connecting the data driver 300 and the metal layers 120a, 120b, 130a, 130b, 140a, and 140b.

The data driver 300, the fan-out lines POx, the sealant 200, the metal layers 120a, 120b, 130a, 130b, 140a, and 140b, and the repair lines RL1 and RL2 may be disposed in a non-display area outside the display area DA.

The plurality of pixels PX is connected to the plurality of data lines Dx and is arranged substantially in a matrix (e.g., in a matrix form). Each of the plurality of data lines Dx extends substantially in a column direction and is substantially parallel with each other. In the display area DA, gate lines and power lines connected to the plurality of pixels PX may be additionally disposed. The gate lines extend substantially in a row direction and are substantially parallel with each other.

The data driver 300 receives an image data signal from a signal controller, selects a gray voltage corresponding to the image data signal, and applies the gray voltage to the plurality of data lines Dx as a data voltage. The data driver 300 may be mounted in a form of a single integrated circuit (IC) chip, mounted on a flexible printed circuit film, attached in a form of a tape carrier package (TCP), or mounted on a separate printed circuit board (PCB).

The sealant 200 is disposed on (e.g., along) a periphery (e.g., a perimeter) of the display area DA and attaches (e.g., joins) an insulation substrate 110, on which the plurality of pixels PX is formed, to an encapsulation member 210. The sealant 200 seals the display area DA and protects the plurality of pixels PX formed in the display area DA. The encapsulation member 210 may be a transparent insulation substrate, such as an organic substrate or a plastic substrate, or a transparent encapsulation thin film including a plurality of passivation layers, layers of which are sequentially stacked.

The data driver 300 may be disposed outside an internal space (e.g., an inner space) formed by the sealant 200, and the plurality of fan-out lines POx connects the data driver 300 disposed outside the sealant and the plurality of data lines Dx formed inside the sealant 200.

The metal layers disposed below the sealant 200 include first metal layers 120a, 130a, and 140a disposed on (e.g., along) a periphery of a region at the right based on a central line of the display area DA (e.g., disposed along a right-side periphery of the display area DA) and second metal layers 120b, 130b, and 140b disposed on a periphery of a region at the left based on the central line of the display area DA (e.g., disposed along a left-side periphery of the display area DA). The first metal layers 120a, 130a, and 140a are electrically insulated from the second metal layers 120b, 130b, and 140b.

A configuration of the first metal layers 120a, 130a, and 140a will be described in more detail with reference to FIGS. 2 and 3. The first metal layers include a first lower metal layer 130a, and a first inner metal layer 120a, and a first outer metal layer 140a. The first inner metal layer 120a and the first outer metal layer 140a are disposed above the first lower metal layer 130a.

The first lower metal layer 130a is disposed on a first insulating layer 113 which is disposed on the insulation substrate 110. The first insulating layer 113 may serve to planarize a surface of the insulation substrate 110 while preventing the infiltration of unnecessary and/or undesired components and/or elements, such as impurities or moisture. The first insulating layer 113 may have a single-layer structure made of, for example, silicon nitride ($SiN_x$) or silicon oxide ($SiO_2$), or a multi-layer structure in which silicon nitride ($SiN_x$) and silicon oxide ($SiO_2$) are stacked. Alternatively, the first insulating layer 113 may be made of an organic insulating material, such as a cellulose derivative, an olefin-based resin, an acrylic resin, a vinyl chloride-based resin, a styrene-based resin, a polyester-based resin, a polyamide-based resin, a polycarbonate-based resin, a polycycloolefin resin, and an epoxy resin. The first insulating layer 113 may not be included in all embodiments and, thus, may be omitted in an embodiment depending on a type of insulation substrate 110 and a process condition.

The first lower metal layer 130a is disposed on the periphery of the right region of the display area DA along the sealant 200. The first lower metal layer 130a may have a greater width than the sealant 200. The first lower metal layer 130a may be formed in a lattice pattern having a plurality of lattice openings 131 (e.g., lattice holes). The first lower metal layer 130a may be formed concurrently (e.g., simultaneously) when a gate line is formed in the display area DA.

The second insulating layer 115 is disposed on the first lower metal layer 130a and the first insulating layer 113. The plurality of lattice openings 131 in the first lower metal layer 130a may be filled with an insulating material of the second insulating layer 115. A third insulating layer 118 is disposed on the second insulating layer 115. The third insulating layer 118 may serve to planarize a surface of the second insulating layer 115. The second insulating layer 115 and the third insulating layer 118 may each have a single-layer structure made of, for example, silicon nitride ($SiN_x$) or silicon oxide ($SiO_2$), or a multi-layer structure in which silicon nitride ($SiN_x$) and silicon oxide ($SiO_2$) are stacked. The second insulating layer 115 and the third insulating layer 118 may be made of an organic insulating material, such as a cellulose derivative, an olefin-based resin, an acrylic resin, a vinyl chloride-based resin, a styrene-based resin, a polyester-based resin, a polyamide-based resin, a polycarbonate-based resin, a polycycloolefin resin, and an epoxy resin.

The first inner metal layer 120a and the first outer metal layer 140a are disposed on the third insulating layer 118. The first inner metal layer 120a and the first outer metal layer 140a are disposed at a same layer and may be formed concurrently (e.g., simultaneously) when the data line Dx is formed in the display area DA. The first inner metal layer 120a and the first outer metal layer 140a are spaced from (e.g., spaced apart from) each other and electrically insulated from each other.

The first inner metal layer 120a may be disposed at the display area DA side based on the sealant 200 (e.g., is nearer to the display area DA than the first outer metal layer 140a with respect to the sealant 200) and overlap a portion of the first lower metal layer 130a. The first inner metal layer 120a is disposed along the periphery of the right region of the display area DA while overlapping the portion of the first lower metal layer 130a. The first inner metal layer 120a is electrically connected to the first lower metal layer 130a through a contact opening 125 (e.g., a contact hole) which passes through the second insulating layer 115 and the third insulating layer 118 and exposes the first lower metal layer 130a. Contact openings 125 (e.g., contact holes) may be formed above the first lower metal layer 130a, which is formed wider than the sealant 200, at the display area DA side along a row.

The first outer metal layer 140a may be disposed at the outside based on the sealant 200 (e.g., may be disposed farther from the display area DA than the first inner metal layer 120a with respect to the sealant 200) and overlap another portion of the first lower metal layer 130a. The first outer metal layer 140a is disposed along the periphery of the right region of the display area DA while overlapping the other portion of the first lower metal layer 130a. The first outer metal layer 140a may be electrically insulated from the first lower metal layer 130a.

The first lower metal layer 130a, the first inner metal layer 120a, and the first outer metal layer 140a may be made of a metal material, such as copper (Cu), aluminum (Al), molybdenum (Mo), and/or silver (Ag). The first lower metal layer 130a, the first inner metal layer 120a, and the first outer metal layer 140a may improve laser absorption at the time of melting or solidification of the sealant 200 when using a laser in a process of sealing the display area DA with the sealant 200.

The sealant 200 is disposed on a portion of the first inner metal layer 120a, a portion of the first outer metal layer 140a, and the third insulating layer 118 between the first inner metal layer 120a and the first outer metal layer 140a which are spaced from each other. The sealant 200 may be formed by a coating method, such as a dispenser method or a printer method (e.g., a screen printing method).

A plurality of openings 135 (e.g., through-holes), which passes through (e.g., are aligned with) the lattice openings 131 in the first lower metal layer 130a and exposes the insulation substrate 110, is formed in the first to third insulating layers 113, 115, and 118. The plurality of openings 135 may be formed at an area where the first inner metal layer 120a overlaps the first lower metal layer 130a, an area where the first outer metal layer 140a overlaps the first lower metal layer 130a, and an area between the first inner metal layer 120a and the first outer metal layer 140a.

One or more of the openings 135 overlapping the first inner metal layer 120a from among the plurality of openings 135 is filled with metal of the first inner metal layer 120a. Another one or more of openings 135 overlapping the first outer metal layer 140a from among the plurality of openings 135 is filled with metal of the first outer metal layer 140a.

Another one or more of the openings 135, which does not overlap the first inner metal layer 120a and the first outer metal layer. 140a but overlaps the sealant 200, from among the plurality of openings 135 is filled with the sealant 200. A width or diameter of the openings 135 is smaller than that of the lattice openings 131. Therefore, the first inner metal layer 120a and the first outer metal layer 140a which fill the openings 135 may be electrically insulated from the first lower metal layer 130a without being in contact with the first lower metal layer 130a. The plurality of openings 135 is not necessarily formed to correspond to all the lattice openings 131 in the first lower metal layer 130a.

The encapsulation member 210 is disposed on the sealant 200.

The second metal layers 120b, 130b, and 140b are configured to substantially correspond to (e.g., to be substantially identical to) the first metal layers 120a, 130a, and 140a, respectively, and thus, configurations of the second metal layers 120b, 130b, and 140b are not illustrated but will be briefly described. The configurations of the second metal layers 120b, 130b, and 140b, which may not described herein, may be the same or substantially the same as those of the first metal layers 120a, 130a, and 140a.

The second metal layer includes a second lower metal layer 130b, and a second inner metal layer 120b and a second outer metal layer 140b disposed above the second lower metal layer 130b.

The second lower metal layer 130b is disposed on a periphery of a left region of the display area DA along the sealant 200. The second lower metal layer 130b may have a greater width than the sealant 200.

The second inner metal layer 120b may be disposed at a display area DA side based on the sealant 200 and overlap a portion of the second lower metal layer 130b. The second inner metal layer 120b is disposed along the periphery of the left region of the display area DA while overlapping the portion of the second lower metal layer 130b. The second inner metal layer 120b is electrically connected to the second lower metal layer 130b through a contact opening 125 which passes through the second insulating layer 115 and the third insulating layer 118 and exposes the first lower metal layer 130a.

The second outer metal layer 140b may be disposed at the outside based on the sealant 200 and overlap another portion of the second lower metal layer 130b. The second outer metal layer 140b is disposed along the periphery of the left region of the display area DA while overlapping the other portion of the second lower metal layer 130b. The second outer metal layer 140b may be electrically insulated from the second lower metal layer 130b.

The repair lines include a first repair line RL1 connecting the data driver 300 and one or more of the first metal layers 120a, 130a, and 140a and a second repair line RL2 connecting the data driver 300 and one or more of the second metal layers 120b, 130b, and 140b. The first repair line RL1 is connected to the first inner metal layer 120a positioned nearest the display area DA. The second repair line RL2 is connected to the second inner metal layer 120b positioned nearest the display area DA. Accordingly, among the first metal layers, the first inner metal layer 120a and the first lower metal layer 130a may be electrically connected to the data driver 300. Further, among the second metal layers, the second inner metal layer 120b and the second lower metal layer 130b may be electrically connected to the data driver 300.

When a disconnection defect occurs in the data line Dx during the manufacturing process of the display device, at the opposite side of one end of the data line Dx connected to the fan-out line POx, the first inner metal layer 120a or the second inner metal layer 120b is connected to the data line Dx, thereby overcoming the disconnection defect of the data line Dx.

The first inner metal layer 120a and the first lower metal layer 130a, and the second inner metal layer 120b and the second lower metal layer 130b, which are positioned below the sealant 200, have much greater widths than the data line Dx and, thus, correspondingly reduced resistances. Accordingly, the data voltage may be sufficiently applied to the pixel having the data voltage applied through the repair lines by using the first inner metal layer 120a and the first lower metal layer 130a or the second inner metal layer 120b and the second lower metal layer 130b, which are positioned below the sealant 200 as the repair lines for overcoming a disconnection defect of the data line Dx. Consequently, the data voltage may be sufficiently applied to the pixel having the data voltage applied through the repair line, and thus, a bar-line spot may be prevented.

The drawings and the detailed description of the invention which are referred to herein are only examples of embodiments of the present invention and are used simply to describe embodiments of the present invention, and should not be used to limit the meaning or the scope of the present invention as described in the claims and their equivalents. Therefore, it will be appreciated by those skilled in the art that various modifications and other equivalent embodiments are available. Accordingly, the true technical scope of the present invention should be defined by the technical spirit of the appended claims and their equivalents.

DESCRIPTION OF SOME OF THE REFERENCE SYMBOLS 120a, 120b: First and second lower metal layers
130a, 130b: First and second inner metal layers
140a, 140b: First and second outer metal layers
200: Sealant
300: Data driver
RL1, RL2: First and second repair lines

What is claimed is:

1. A display device comprising:
a plurality of pixels;
a plurality of data lines connected to the plurality of pixels;
a data driver configured to generate a data voltage applied to the plurality of pixels;
a plurality of fan-out lines configured to connect the plurality of data lines and the data driver;
a sealant at a periphery of a display area in which the plurality of pixels and the plurality of data lines are arranged, and configured to seal the display area;
a lower metal layer below the sealant;
an insulating layer covering the lower metal layer;
an inner metal layer on the insulating layer above the lower metal layer, the lower metal layer and the inner metal layer being electrically connected through a contact opening in the insulating layer; and
a repair line configured to connect the data driver and the inner metal layer.

2. The display device of claim 1, further comprising:
a second metal layer at a left-side periphery of the display area with respect to a central line of the display area,
wherein the lower metal layer and the inner metal layer are at a right-side periphery of the display area with respect to the central line of the display area, and
wherein the lower and inner metal layer are electrically insulated from the second metal layer.

3. The display device of claim 1, wherein the inner metal layer overlaps a portion of the lower metal layer.

4. A display device comprising:
a plurality of pixels;
a plurality of data lines connected to the plurality of pixels;
a data driver configured to generate a data voltage applied to the plurality of pixels;
a plurality of fan-out lines configured to connect the plurality of data lines and the data driver;
a sealant at a periphery of a display area in which the plurality of pixels and the plurality of data lines are arranged, and configured to seal the display area;
a metal layer below the sealant, the metal layer comprising:
a first metal layer at a right-side periphery of the display area with respect to a central line of the display area; and
a second metal layer being electrically insulated from the first metal layer and at a left-side periphery of the display area with respect to the central line of the display area; and
a repair line configured to connect the data driver and the metal layer, the repair line comprising:
a first repair line configured to connect the data driver and the first metal layer; and
a second repair line configured to connect the data driver and the second metal layer.

5. The display device of claim 4, wherein the first metal layer comprises:
a first lower metal layer at the right-side periphery and below the sealant; and
a first inner metal layer above the first lower metal layer and overlapping a portion of the first lower metal layer,
wherein the first lower metal layer and the first inner metal layer are electrically connected through a contact opening in an insulating layer between the first lower metal layer and the first inner metal layer.

6. The display device of claim 5, wherein the first inner metal layer extends along the right-side periphery and overlaps the portion of the first lower metal layer.

7. The display device of claim 5, wherein the first metal layer further comprises:
a first outer metal layer overlapping another portion of the first lower metal layer.

8. The display device of claim 7, wherein the first outer metal layer extends along the right-side periphery and overlaps the other portion of the first lower metal layer, and is electrically insulated from the first lower metal layer.

9. The display device of claim 7, wherein the first inner metal layer is nearer to the display area than the first outer metal layer.

10. The display device of claim 9, wherein the first repair line is connected to the first inner metal layer.

11. The display device of claim 7, wherein the first lower metal layer has a lattice pattern and a plurality of lattice openings.

12. The display device of claim 11, further comprising:
an insulation substrate below the first lower metal layer; and
a plurality of openings aligned with the plurality of lattice openings and exposing the insulation substrate,
wherein one of the openings overlapping the first inner metal layer from among the plurality of openings is filled with metal of the first inner metal layer, and one of the openings overlapping the first outer metal layer from among the plurality of openings is filled with metal of the first outer metal layer.

13. The display device of claim 12, wherein one of the openings which is offset from the first inner metal layer and the first outer metal layer but overlaps the sealant from among the plurality of openings is filled with the sealant.

14. The display device of claim 13, wherein a diameter of the opening overlapping the first inner metal layer from among the plurality of openings is less than that of the lattice opening.

15. The display device of claim 7, wherein the second metal layer comprises:
   a second lower metal layer at the left-side periphery and below the sealant; and
   a second inner metal layer above the second lower metal layer and overlapping a portion of the second lower metal layer,
   wherein the second lower metal layer and the second inner metal layer are electrically connected through a contact opening in an insulating layer positioned between the second lower metal layer and the second inner metal layer.

16. The display device of claim 15, wherein the second inner metal layer extends along the left-side periphery and overlaps the portion of the second lower metal layer.

17. The display device of claim 15, wherein the second metal layer further comprises:
   a second outer metal layer overlapping another portion of the second lower metal layer.

18. The display device of claim 17, wherein the second outer metal layer extends along the left-side periphery and overlaps the other portion of the second lower metal layer, and is electrically insulated from the second lower metal layer.

19. The display device of claim 17, wherein the second inner metal layer is nearer the display area than the second outer metal layer.

20. The display device of claim 19, wherein the second repair line is connected to the second inner metal layer.

* * * * *